United States Patent [19]
Morita et al.

[11] Patent Number: 6,121,636
[45] Date of Patent: *Sep. 19, 2000

[54] SEMICONDUCTOR LIGHT EMITTING DEVICE

[75] Inventors: Etsuo Morita; Hiroji Kawai, both of Kanagawa, Japan

[73] Assignees: Sony Corporation; Sony Chemicals Corporation, both of Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/072,177

[22] Filed: May 5, 1998

[30] Foreign Application Priority Data

May 6, 1997 [JP] Japan ..................................... 9-115860

[51] Int. Cl.[7] .............................. H01L 29/78; H01L 33/00
[52] U.S. Cl. ............................................. 257/99; 257/103
[58] Field of Search ....................................... 257/99, 103

[56] References Cited

U.S. PATENT DOCUMENTS

3,813,587   5/1974   Umeda .
5,798,537   8/1998   Nitta .
5,868,951   2/1999   Schuck, III .

*Primary Examiner*—Stephen D. Meier
*Attorney, Agent, or Firm*—Hill & Simpson

[57] ABSTRACT

A semiconductor light emitting device is provided, which does not deteriorate in luminance, maintains a high reliability, permits more free choice of an adhesive, and promises effective extraction of light to the exterior even when it is bonded to a lead frame or other support with the adhesive in practical use. In a GaN light emitting diode, GaN compound semiconductor layers are stacked sequentially on a front surface of a sapphire substrate to form a light emitting diode structure, and a reflective film is formed on a rear surface. Alternatively, the GaN compound semiconductor layers forming the light emitting diode structure are selectively removed by etching to define an inverted mesa-shaped end surface, and the reflective film is formed on the end surface. Both the p-side electrode and the n-side electrode are formed on a common side of the substrate where the GaN compound semiconductor layers are formed.

18 Claims, 6 Drawing Sheets

SEMICONDUCTOR LIGHT EMITTING DEVICE

BACKGROUND OF THE INVENTION

1. Field of the Invention

This invention relates to a semiconductor light emitting device and, more particularly, to a semiconductor light emitting device using nitride III–V compound semiconductors.

2. Description of the Related Art

Known as semiconductor light emitting devices capable for emitting green to blue to ultraviolet light are those having light emitting diode structures in which nitride III–V compound semiconductors having wurtzite-structured crystalline structures, represented by gallium nitride (GaN), epitaxially grown on a sapphire substrate or a silicon carbide (SiC) substrate.

Figure 1:
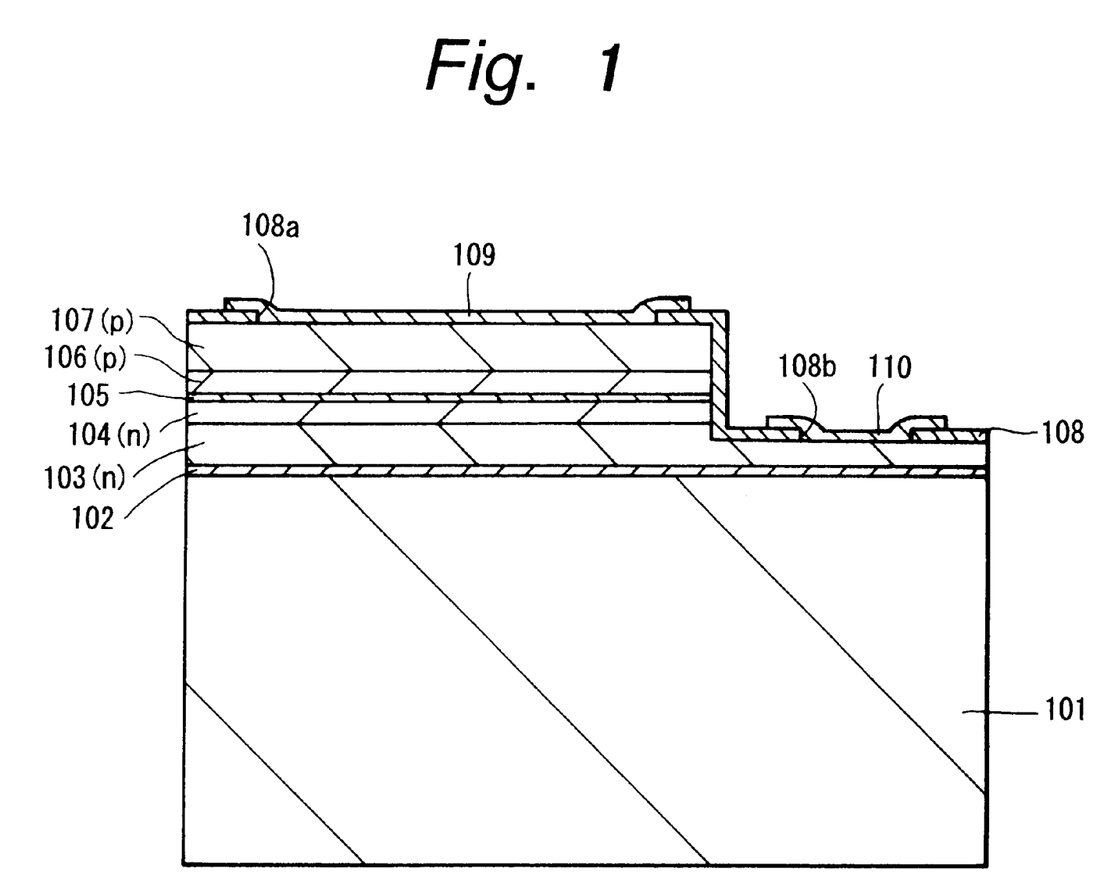
FIG. 1 is a cross-sectional view showing a conventional GaN light emitting diode.

FIG. 1 shows a typical GaN light emitting diode having a conventional double heterostructure. As shown in FIG. 1, the conventional GaN light emitting diode includes a GaN buffer layer 102, n-type GaN layer 103, n-type AlGaN layer 104, GaInN light emitting layer 105, p-type AlGaN layer 106 and p-type GaN layer 107 which are stacked sequentially on a sapphire substrate 101. An upper lying part of the n-type GaN layer 103, n-type AlGaN layer 104, light emitting layer 105, p-type AlGaN layer 106 and p-type GaN layer 107 have a predetermined configuration defining an edge substantially normal to the substrate surface. These surfaces are covered with an insulation film 108 made of $SiO_2$, for example, to protect these surfaces. The insulation film 108 has formed apertures 108a, 108b on the p-type GaN layer 107 and the n-type GaN layer 103, respectively. The p-side electrode 109 contact the p-type GaN layer 107 through the aperture 108a, and the n-side electrode 109 contacts the n-type GaN layer 108 through the aperture 108b.

Figure 2:
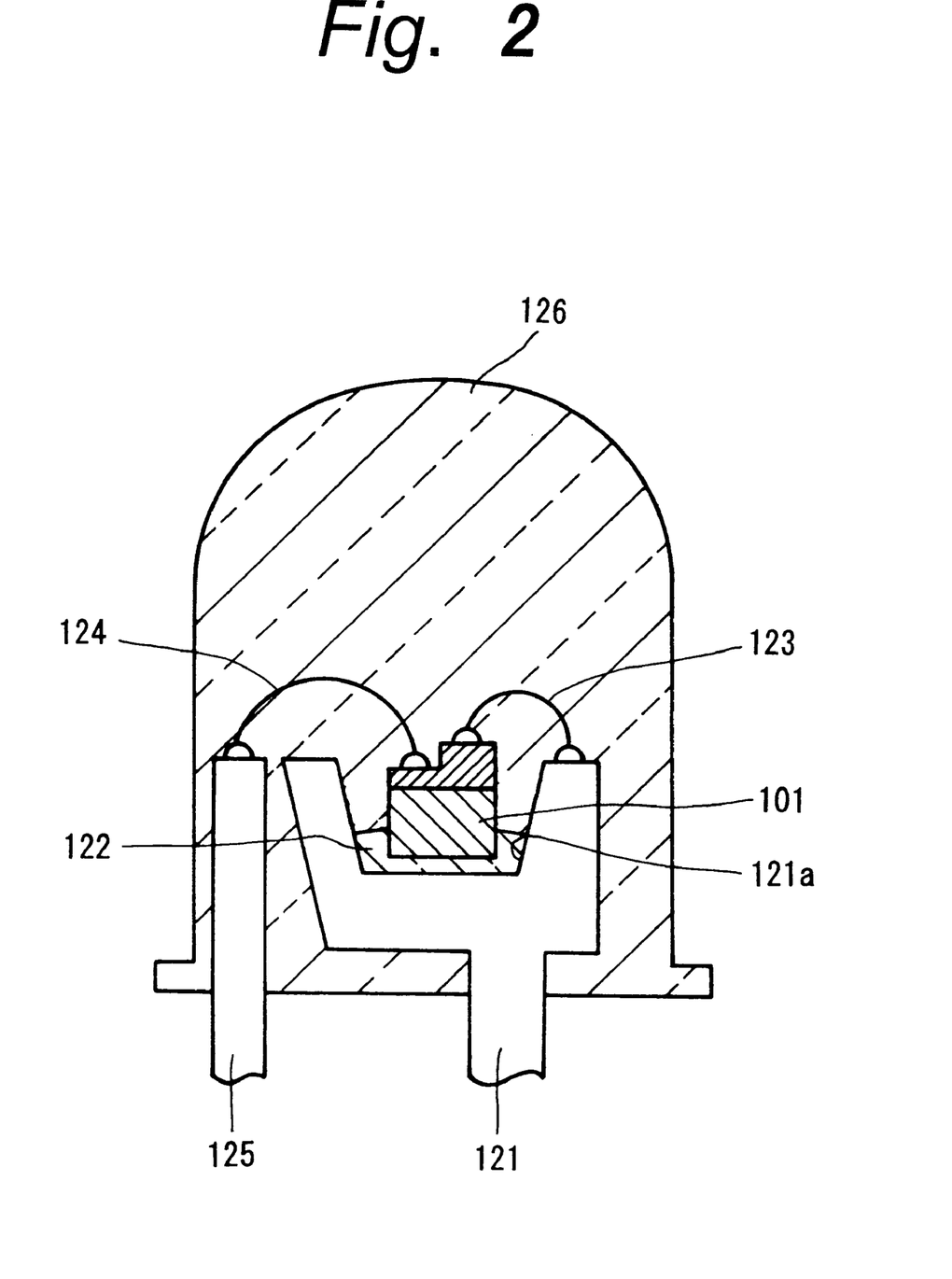
FIG. 2 is a cross-sectional view of a conventional mold-packed GaN light emitting diode.

Such GaN light emitting diodes are typically used in a mold-packed form using a resin as shown in FIG. 2 (for example, Japanese Patent Laid-Open Publication No. Hei 8-78727). That is, as shown in FIG. 2, in the mold-packed GaN light emitting diode, the sapphire substrate 101 of the GaN light emitting diode shown in FIG. 1 is bonded to the bottom surface of a depression 121a along the upper surface of a lead frame 121 with an adhesive 122. The bottom surface 121 and inner wall surfaces of the depression 121a serve as reflective surfaces for externally directing light departing from the light emitting layer 105 when the GaN light emitting diode operates. Used as the adhesive 122 is an epoxy resin adhesive. The p-side electrode 109 (not shown in FIG. 2) of the GaN light emitting diode is connected to the lead frame 121 by a wire 123, and the n-side electrode 110 (not shown in FIG. 2) is connected to a lead frame 125 by a wire 124. Then, the GaN light emitting diode is mold-packed together with adjacent parts of the lead frames 121, 125 in the resin 126 in a lens-shaped configuration for purposes of collecting light, among others.

However, conventional mold-packed GaN light emitting diodes are subject to deterioration with time, namely deterioration in luminance. A reason would be that the adhesive 122 is optically changed in color, or colored, due to an influence by light from the light emitting layer 104 of the GaN light emitting diode 105, and results in decreasing the transmittance and decreasing the intensity of light departing from the bottom surface of the sapphire substrate 101, passing through the adhesive 122, reflected by surfaces of the lead frame 121, and extracted to the exterior.

SUMMARY OF THE INVENTION

It is therefore an object of the invention to provide a semiconductor light emitting device free from deterioration in luminance even when bonded to a lead frame or another base body with an adhesive in practical use, and therefore promising a high reliability.

Another object of the invention is to provide a semiconductor light emitting device permitting the use of an adhesive selected from more kinds of adhesives to bond it to a lead frame or another base body in its practical use.

Another object of the invention is to provide a semiconductor light emitting device enabling effective extraction of light to the exterior.

According to a first aspect of the invention, there is provided a semiconductor light emitting device having nitride III–V compound semiconductor layers which form a light emitting device structure on one of major surfaces of a light transmitting substrate, comprising:

a reflective film formed on the other of the major surfaces of said substrate.

In the first aspect of the invention, the reflective film may be a single-layered or multi-layered film of metals, alloys or semiconductors such as GaN, AlN, InN, or Si, or alternatively a multi-layered insulation film such as silicon oxide ($SiO_2$) or silicon nitride (SiN) film. Moreover, the reflective film may be a multi-layered film made by stacking a semiconductor film and an insulation film, such as combinations of Si with $SiO_2$ or SiN, for example. A similar reflective film may be formed also on the end surfaces of nitride III–V compound semiconductor layers. Usable as the substrate are a sapphire substrate, silicon carbide (SiC) substrate or gallium nitride (GaN) substrate.

According to a second aspect of the invention, there is provided a semiconductor light emitting device having nitride III–V compound semiconductor layers which form a light emitting device structure on one of major surfaces of a light transmitting substrate, comprising:

at least a part of end surfaces of the nitride III–V compound semiconductor layers has an inverted mesa configuration.

In the second aspect of the invention, a reflective film is formed on end surfaces of the nitride III–V compound semiconductor layers to enhance the reflectance of t he these surfaces and to ensure more effective extraction of light to the exterior. The reflective film is typically a multi-layered insulation film of $SiO_2$ or SiN. Usable as the substrate are a sapphire substrate, SiC substrate and GaN substrate, for example. If a light transmissive substrate is used, an additional reflective film is preferably formed on the other major surface of the substrate to extract light more effectively to the exterior.

In the present invention, when the reflective film is formed on the other major surface, namely, the rear surface, of a light transmissive substrate, the reflective film is formed directly on the rear surface, or via a light transmissive smoothing film if the rear surface is not sufficiently smooth. Thus, the reflectance of the rear surface of the substrate can be increased.

In the present invention, both the p-side electrode and the n-side electrode are typically formed on a common side of the substrate where the nitride III–V compound semiconductor layers are formed.

In the present invention, each nitride III–V compound semiconductor contains at least one group III element selected from the group consisting of Al, Ga and In, and group V elements including at least N, such as GaN, AlGaN and GaInN, for example.

According to the first aspect of the invention summarized above, since the reflective film is formed on the other major surface of the substrate opposite from one major surface on which the nitride III–V compound semiconductors forming the light emitting device structure are stacked, light emitted from the light emitting layer of the semiconductor light emitting device and running into the substrate toward the other major surface during operation of the device can be reflected back not to exit through it to the exterior. Therefore, when the semiconductor light emitting device is bonded to a lead frame or any other base body with an adhesive in its practical use, the amount of light entering into the adhesive can be decreased remarkably.

According to the second aspect of the invention, since at least a part of the edge of the nitride III–V compound semiconductor layers forming the light emitting device structure has the inverted mesa configuration, light emitted from the light emitting layer of the semiconductor light emitting device during operation of the device can be reflected back from the inverted mesa-shaped edge toward the direction opposite from the substrate.

The above, and other, objects, features and advantage of the present invention will become readily apparent from the following detailed description thereof which is to be read in connection with the accompanying drawings.

DESCRIPTION OF THE PREFERRED EMBODIMENTS

Explained below are embodiments of the invention with reference to the drawings. In all figures showing embodiment of the invention, the same or equivalent elements are labeled with common reference numerals.

Figure 3:
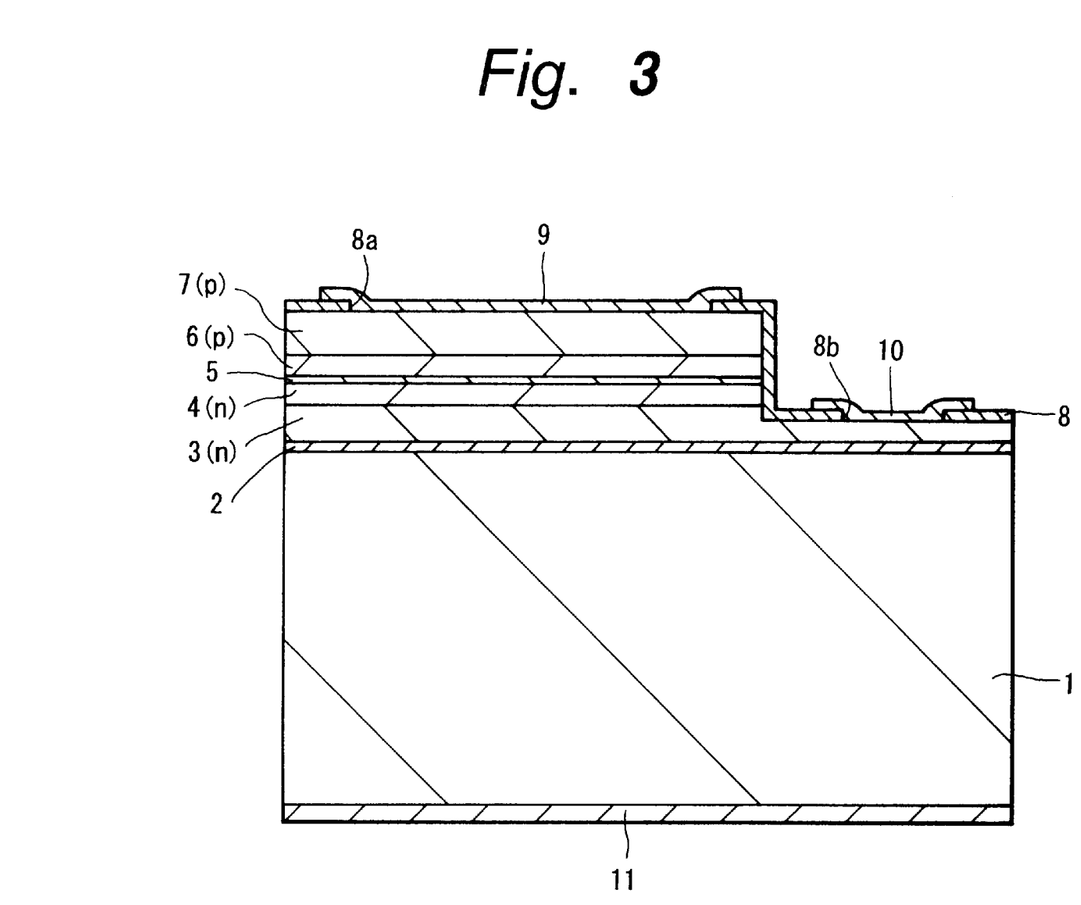
FIG. 3 is a cross-sectional view of a GaN light emitting diode according to a first embodiment of the invention.

FIG. 3 shows a GaN light emitting diode having a double heterostructure according to the first embodiment of the invention. As shown in FIG. 3, the GaN light emitting diode includes a GaN buffer layer 2, n-type GaN layer 3, n-type AlGaN layer 4, GaInN light emitting layer 5, p-type AlGaN layer 6 and p-type GaN layer 7 stacked sequentially on a sapphire substrate 1. An upper part of the n-type GaN layer 3, n-type AlGaN layer 4, light emitting layer 5, p-type AlGaN layer 6 and p-type GaN layer 7 have a predetermined configuration defining an edge normal to the substrate surface. An insulation film 8 such as $SiO_2$ film is provided to cover these surfaces to protect them. The insulation film 8 has formed apertures 8a, 8b on the p-type GaN layer 7 and the n-type GaN layer 3, respectively. The p-side electrode 9 contacts the p-type GaN layer 7 through the aperture 8a, and the n-side electrode 10 contacts the n-type GaN layer 3 through the aperture 8b. The p-side electrode 9 may be a Au film, for example, and the n-side electrode 10 may be a Ti/Al/Au film, for example.

In addition to the above-explained structure, which is the same as that of the conventional GaN light emitting diode shown in FIG. 1, the GaN light emitting diode shown here additionally includes a reflective film 11 on the back surface of the sapphire substrate 1. The reflective film 11 is s single-layered Au film, for example. Since the reflective film 11 is provided on the back surface of the sapphire substrate 1 reflects, part of light which leaves the light emitting layer 5 of the GaN light emitting diode during its operation and otherwise would pass through and exit from the back surface of the sapphire substrate 1 can be reflected by the reflective film 11 toward the substrate 1.

Figure 4:
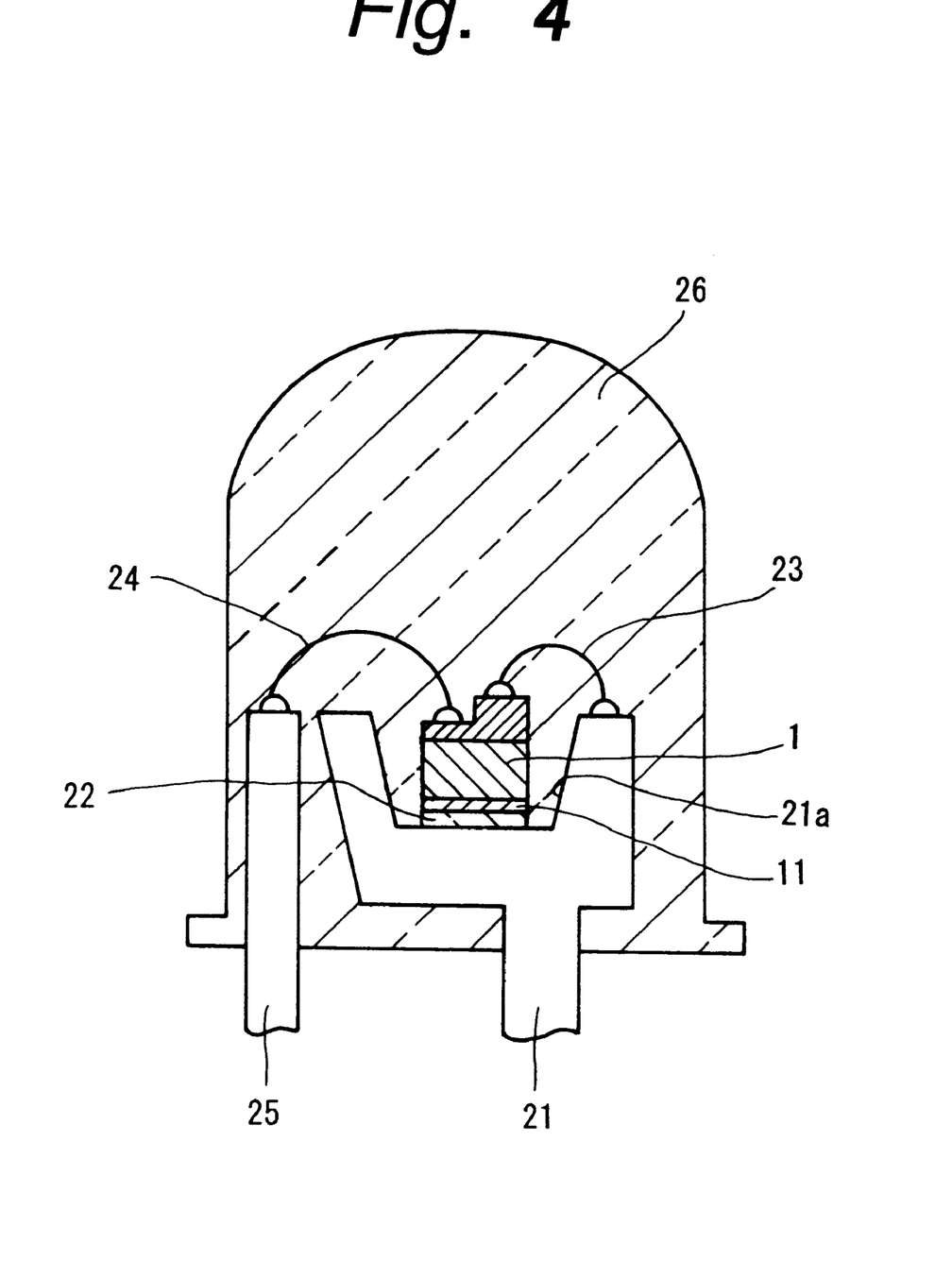
FIG. 4 is a cross-sectional view of a mold-packed GaN light emitting diode according to the first embodiment of the invention.

FIG. 4 is the GaN light emitting diode mold-packed in a resin. As shown in FIG. 4, the reflective film 11 on the back surface of the sapphire substrate 1 of the GaN light emitting diode shown in FIG. 3 is bonded to the bottom surface of a depression 21a along he upper surface of a lead frame 21 with an adhesive 22. The bottom surface and inner wall surface of the depression 21a serve as reflective surfaces for externally directing the light generated by the GaN light emitting diode. Usable as the adhesive 22 is an epoxy resin adhesive. The p-side electrode 9 (not shown in FIG. 4) of the GaN light emitting diode is connected to the lead frame 21 with a wire 23, and the n-side electrode 10 (not shown in FIG. 4) is connected to a lead frame 25 with a wire 24. The GaN light emitting diode and adjacent parts of the lead frames 21, 25 are mold-packed in a resin 26 in form of a lens for the purpose of collecting light, among others. The resin 26 may be an epoxy resin, for example.

In the mold-packed GaN light emitting diode, part of light departing from the light emitting layer 5 of the GaN light emitting diode during its operation and would otherwise passes through and exit from the back surface of the sapphire substrate 1 can be reflected by the reflective film 11 toward the sapphire substrate 1. Therefore, the amount of light entering into the adhesive 22 can be decreased remarkably, and the light can be effectively extracted to the exterior by the reflective film 11.

Next explained is a process for manufacturing the GaN light emitting diode according to the first embodiment and a process for packaging the mold-packed GaN light emitting diode.

To fabricate the GaN light emitting diode, as shown in FIG. 3, the GaN buffer layer 2 is grown on the sapphire substrate 1 by metal-organic chemical vapor deposition (MOCVD), for example, under a low temperature around 550° C. Then, the n-type GaN layer 3, n-type AlGaN layer 4, GaInN light emitting layer 5, p-type AlGaN layer 6 and p-type GaN layer 7 are epitaxially grown in sequence on the GaN buffer layer 2 at a temperature around 1000° C., for example. After that, a resist pattern (not shown) of a predetermined configuration is formed on the p-type GaN layer 7. Using the resist pattern as a mask, the layers are partly removed to the depth reaching a half depth of the n-type GaN layer 3 by anisotropic etching using reactive ion etching (RIE), for example, to form a groove. Then, the resist pattern is removed.

Next formed is the insulation film 8, such as $SiO_2$ film, on the entire surface including the side surface of the groove by CVD or sputtering, for example. Then, the insulation film 8 is selectively removed by etching to form the apertures 8a and 8b. After that, a Au film is formed on the entire surface by vacuum evaporation or sputtering, for example, and then patterned in by etching into a predetermined configuration to form the p-side electrode 9 in the aperture 8*a*. Additionally, a Ti/Al/Au film, for example, is formed on the entire surface by vacuum evaporation or sputtering, for example, and then patterned into a predetermined configuration to form the n-side electrode 10 in the aperture 8*b*.

After that, the rear surface of the sapphire substrate 1 is carved by lapping or cutting, where necessary, to provide a desired thickness of the sapphire substrate 1, and further flattened by chemical-mechanical polishing or chemical etching to obtain a specular rear surface. The flattening step, however, can be omitted if the sapphire substrate 1 is originally prepared to be specular on the rear surface.

Next formed is the reflective film 11 by depositing a Au film, for example, on the rear surface of the sapphire substrate 1 by vacuum evaporation or sputtering.

If the rear surface of the sapphire substrate cannot be smoothed, or is used while having unevenness just after lapping or cutting, then a light-transmissive smoothing film of $SiO_2$, SiN or glass is formed on the rear surface of the sapphire substrate 1 to smooth it, and the reflective film 11 is formed on the smoothing film. CVD, sputtering or vacuum evaporation can be used to make the smoothing film. Also usable as the smoothing film is a resin film such as acrylic resin or epoxy resin in lieu of the inorganic film shown above. Resin films can be made to provide a uniform and smooth surface by spin coating or vacuum evaporation, for example.

After that, the sapphire substrate 1 having formed the light emitting diode structure is separated into chips by dicing or scribing. The reflective film 11 may be made on each separated chip.

The GaN light emitting diode, thus fabricated, is packaged in the following process. As shown in FIG. 4, the reflective film 11 on the rear surface of the sapphire substrate 1 of the GaN light emitting diode is bonded to the bottom surface of the depression 21*a* of the lead frame 21 with the adhesive 22. Thereafter, The GaN light emitting diode is mold-packed together with adjacent parts of the lead frames 21, 25 in a resin 26 shaped into the form of a lens. Thus, the mold-packed GaN light emitting diode is completed.

According to the first embodiment described above, since the GaN light emitting diode has the reflective film 11 on the rear surface of the sapphire substrate 1, even when it is on the lead frame 21 with its reflective film 11 bonded to the bottom surface of the depression 21*a* of the lead frame 21 with the adhesive 22, the reflective film 11 prevents part of light leaving the light emitting layer 5 and entering into the sapphire substrate 1 from exiting to the exterior from the rear surface of the substrate 1, and remarkably decreases the amount of light entering into the adhesive beyond the reflective film 11. Thus, the adhesive 22 is effectively prevented from being optically change in color or colored due to influences of light, and can maintain its original transmittance. As a result, the mold-packed GaN light emitting diode is not deteriorated in luminance, and is improved in reliability. Moreover, since part of light leaving the light emitting layer 5 and running into the sapphire substrate 1 toward its rear surface is reflected back by the reflective film 11 before reaching the adhesive 22, the adhesive 22 need not be transparent such as epoxy resin, and any adhesive selected from various kinds of adhesives, like those quickly setting or those less expensive, for example, may be used. That is, the freedom of choosing an adhesive is increased.

Figure 5:
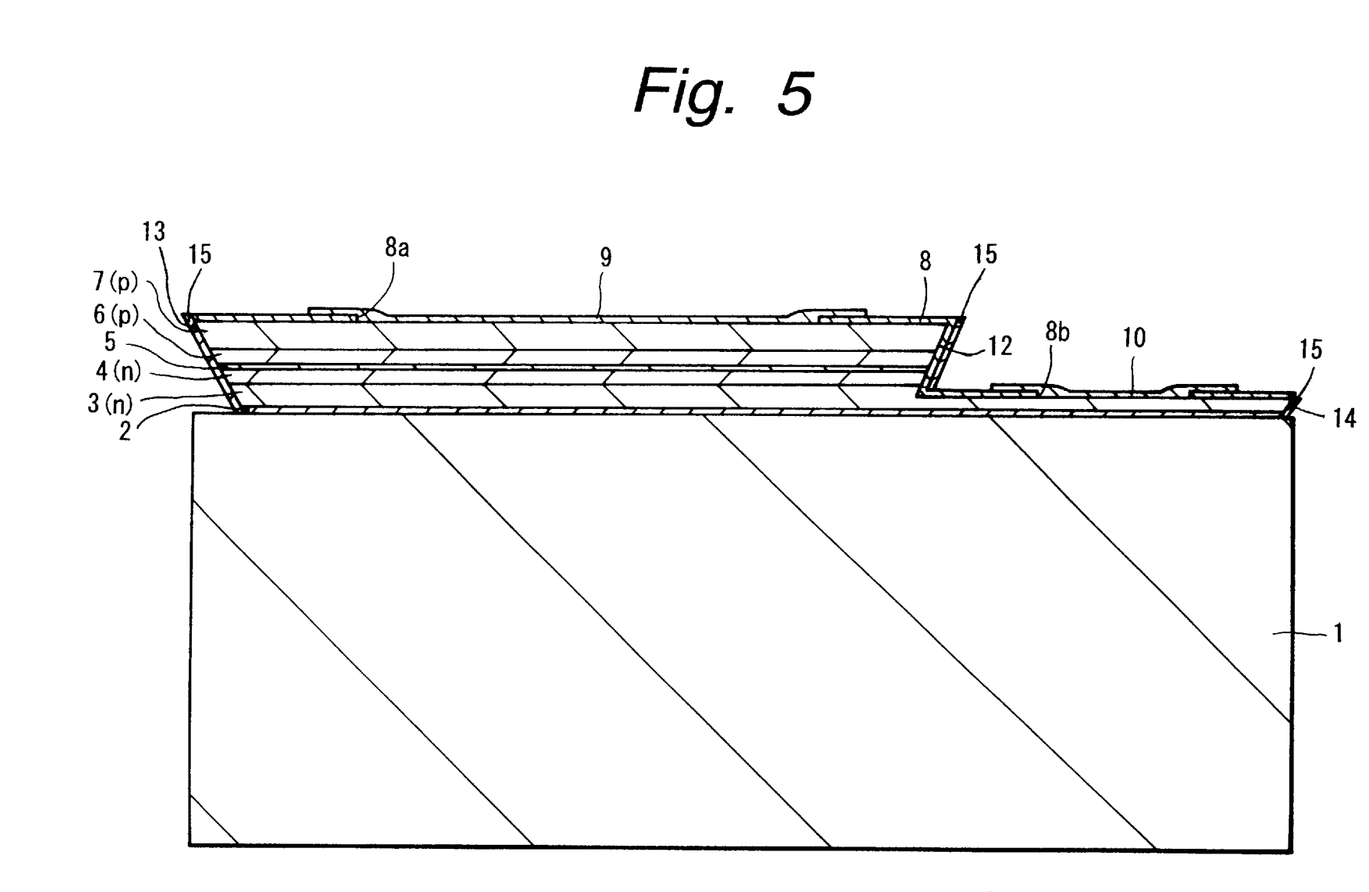
FIG. 5 is a cross-sectional view of a GaN light emitting diode according to a second embodiment of the invention.

FIG. 5 shows a GaN light emitting diode according to the second embodiment of the invention. As shown in FIG. 5, an upper part of the n-type GaN layer 3, n-type AlGaN layer 4, light emitting layer 5, p-type AlGaN layer 6 and p-type GaN layer 7 are shaped to define an inverted mesa-type edge 12. They also define inverted mesa-type edges 13 and 14 on their outermost circumferences. These edges 12, 13 and 14 are formed in locations offset from both the p-side electrode 9 and the n-side electrode 10 so that the electrode do not disturb the light reflected and oriented to the exterior by the end surfaces. More specifically, the edge 12 is formed between the p-side electrode 9 and the n-side electrode 10, the edge 13 outside the p-side electrode 9, and the edge 14 outside the n-side electrode 10. These edges 12, 13 and 14 are highly smoothed surfaces made by etching to minimize the loss of light by scattering or irregular reflection. Reflective films 15 are formed on these edges 12, 13 and 14. Usable as the reflective film 15 is a multi-layered insulation film. These edges 12, 13 and 14 are preferably angled by approximately 45° to most effectively extract light from the light emitting layer 5 of the GaN light emitting diode to the exterior. However, the angle it not limited to the value, but may be chosen appropriately. In this embodiment, the sapphire substrate 1 has no reflective film 11 on the rear surface. In the other respect, the second embodiment is the same as the first embodiment.

In the GaN light emitting diode shown here, since the n-type GaN layer 3, n-type AlGaN layer 4, light emitting layer 5, p-type AlGaN layer 6 and p-type GaN layer 7 have inverted mesa-type end surfaces 12, 13 and 14, and the reflective films 15 cover these end surfaces 12, 13 and 14, part of light leaving the light emitting layer 5 and reaching the end surfaces 12, 13 and 14 can be reflected back by the end surfaces 12, 13 and 14 in the direction opposite from the sapphire substrate 1.

Figure 6:
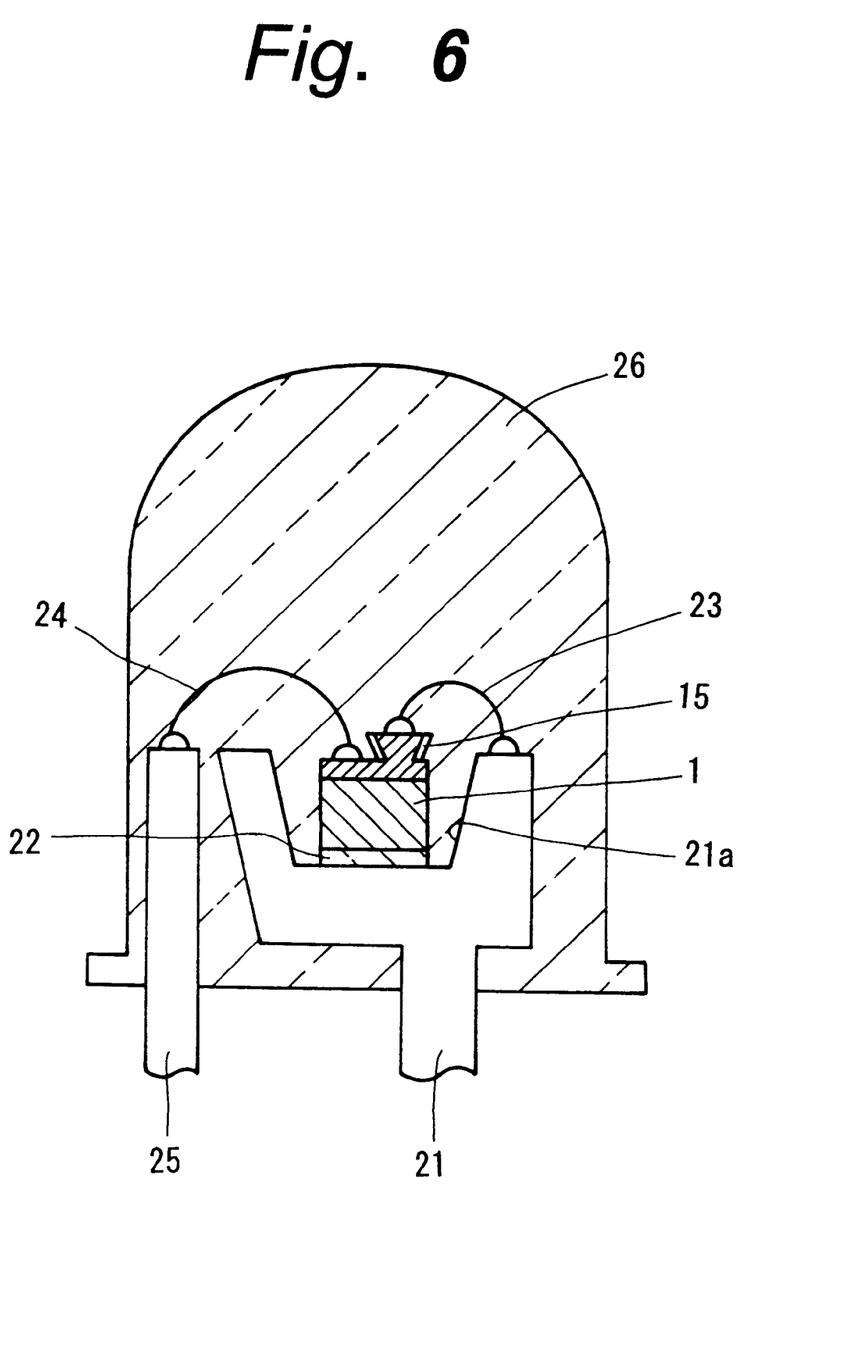
FIG. 6 is a cross-sectional view of a moldpacked GaN light emitting diode according to the second embodiment of the invention.

FIG. 6 shows the GaN light emitting diode mold-packed in a resin. As shown in FIG. 6, in the mold-packed GaN light emitting diode, the back surface of the sapphire substrate 1 of the GaN light emitting diode shown in FIG. 4 is bonded to the bottom surface of the depression 21*a* of the lead frame 21 with the adhesive 22. In the other respects, the mold-packed diode is the same as that of the first embodiment.

In the mold-packed GaN light emitting diode shown here, since part of light leaving the light emitting layer 5 and reaching the end surfaces 12, 13 and 14 of the n-type GaN layer 3, n-type AlGaN layer 4, light emitting layer 5, p-type AlGaN layer 6 and p-type GaN layer 7 is reflected by the end surfaces and oriented in the direction opposite from the sapphire substrate 1, light can be extracted effectively to the exterior, and the amount of light entering into the adhesive 22 can be decreased remarkably.

The reason of using the reflective films 15 on the inverted mesa-type end surfaces 12, 13 and 14 of the GaN light emitting diode lies in that, when the GaN light emitting diode is mold-packed in the resin 26 as shown in FIG. 6, the difference in refractive index between the nitride III–V compound semiconductor layers forming the light emitting diode structure and the resin 26 decreases than that before mold-packing, and results in decreasing the effects of reflection by the end surfaces 12 through 14 and in permitting a more amount of light to pass through them. The reflective films 15 prevent such phenomenon. The reason why the angles of the end surfaces 12, 13 and 14 may be other than 45° lies in that the resin 26 is shaped in form of a lens having a light collecting function.

To fabricate the GaN light emitting diode according to the second embodiment, after the GaN buffer layer 2 is grown on the sapphire substrate 1, the n-type GaN layer 3, n-type AlGaN layer 4, light emitting layer 5, p-type AlGaN 6 and p-type GaN layer 7 are epitaxially grown sequentially on the GaN buffer layer 2 as shown in FIG. 5 in the same manner as the first embodiment. After that, a resist pattern (not shown) of a predetermined configuration is formed on the p-type GaN layer 7 by lithography. Using the resist pattern as a mask, the layers are partly removed by etching to the depth reaching a half depth of the n-type GaN layer 3 by RIE to form a groove defining an inverted mesa-type side surface (corresponding to the end surface 12). The resist pattern is removed thereafter. For etching the layers into the inverted mesa configuration, an induction coupled plasma-reactive ion etching (ICP-RIE) apparatus, for example, can be used to create a plasma density under a low pressure. The pressure may be 1 Pa or less, for example. Used as the etching gas is one containing, for example, a chloride-based gas.

After that, the insulation film 8, such as $SiO_2$ film, is formed on the entire surface including the side surface of the groove by CVD or sputtering, for example. Then the reflective film 15, which may be a multi-layered insulation film, is formed on the end surface 12 via the insulation film 8 by CVD or sputtering, for example. The insulation film 8 is next removed selectively by etching to form the apertures 8a and 8b. Thereafter, in the same manner as the first embodiment, the p-side electrode 9 is formed in the aperture 8a, and the n-side electrode 10 is formed in the aperture 8b.

Then, a resist pattern (not shown) having a predetermined configuration is formed on the insulation film 8 by lithography. Using the resist pattern as a mask, the layers are selectively removed by etching by RIE until exposing the sapphire substrate 1 to form the inverted mesa-type end surfaces 13 and 14. In this etching step, the same ICP-RIE apparatus and conditions as used in the former etching step may be used. After that, the reflective films 15, each being a multi-layered film, for example, are formed on the end surfaces 13 and 14 by CVD or sputtering, for example.

Thereafter, in the same manner as the first embodiment, through the step of lapping the rear surface of the sapphire substrate 1 and subsequent steps, the intended GaN light emitting diode is obtained.

The GaN light emitting diode, thus obtained, is packaged in the same manner as the first embodiment, to obtain the mold-packed GaN light emitting diode as shown in FIG. 6.

According to the second embodiment described above, since the GaN light emitting diode has the inverted mesa-type very smooth end surfaces 12, 13 and 14 made by etching the n-type GaN layer 3, n-type AlGaN layer 4, light emitting layer 5, p-type AlGaN layer 6 and p-type GaN layer 7 by etching and has the reflective film 15 covering the end surfaces 12 to 14, light from the light emitting layer 5 can be directly, effectively extracted to the exterior by reflecting it by these end surfaces 12 to 14 in the direction opposite from the sapphire substrate. Additionally, the amount of light entering into the adhesive 22 can be decreased remarkably to prevent the adhesive 22 from optically changing in color or being colored. As a result, the mold-packed GaN light emitting diode is not deteriorated in luminance, and is improved in reliability. Moreover, for the same reason as explained with the first embodiment, the adhesive 22 need not be transparent such as epoxy resin, and any adhesive selected from various kinds of adhesives, like those quickly setting or those less expensive, for example, may be used. That is, the freedom of choosing an adhesive is increased.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, the reflective film used in the first embodiment may be extended over the end surfaces of the sapphire substrate 1, where appropriate. Also in the second embodiment, an additional reflective film may be formed on the rear surface of the sapphire substrate 1, if appropriate.

Although the end surfaces 12 to 14 in the second embodiment are located offset from both the p-side electrode and the n-side electrode 10, if these electrodes are amply thin and transparent, the end surfaces 12 to 14 may be made in any location without paying particular attentions to their positional relations with the electrodes.

The first and second embodiments have been explained as using MOCVD for growth of nitride III–V compound semiconductor layers forming the light diode structure; however, molecular beam epitaxy (MBE), for example, may be used to grow them.

Instead of the sapphire substrate 1 used in the first and second embodiments, a SiC substrate or GaN substrate may be used, where appropriate.

Although the GaN light emitting diode according to the first or second embodiment is shown as being mounted on a lead frame 21 having the depression 21a and a reflective structure, it may be mounted on a lead frame having no such reflective structure. In this case, also, the same effects are promised.

The GaN light emitting diode has been explained with the first and second embodiments as being mold-packed in the resin 26; however, any other appropriate material, such as cool-melting glass, may be used as the packing material.

As explained above, according to the first aspect of the invention, the reflective film provided on the opposite main surface, i.e. the rear surface, of the substrate prevents the adhesive from being optically changed in color or from optically colored due to influences of light from the light emitting layer when the light emitting element is bonded to a lead frame or other support with the adhesive in practical use. As a result, deterioration in luminance can be prevented, and the reliability is improved. Additionally, any appropriate adhesive may be selected from much wider groups of adhesives.

According to the second aspect of the invention, the inverted mesa-type end surfaces formed at least on selective portions of the nitride III–V compound semiconductor layers forming the light emitting device structure contributes to effective extraction of light to the exterior.

What is claimed is:

1. A semiconductor light emitting device having nitride III–V compound semiconductor layers which form a light emitting structure on one of two oppositely facing major surfaces of a light transmitting substrate, comprising:
   a reflective insulation film formed on the other of said major surfaces of said substrate, said reflective layer effective to prevent light from exiting said substrate via said other of said major surfaces.

2. A semiconductor light emitting device according to claim 1 wherein said substrate is a sapphire substrate, a silicon carbide substrate or a gallium nitride substrate.

3. A semiconductor light emitting device according to claim 1 wherein both a p-side electrode and an n-side electrode are formed on one side of said substrate where said nitride III–V compound semiconductor layers are formed.

4. A semiconductor light emitting device according to claim 1 wherein a reflective film is formed on end surfaces of said nitride III–V compound semiconductor layers.

5. A semiconductor light emitting device according to claim 4 wherein at least a part of end surfaces of said nitride III–V compound semiconductor layers has an inverted mesa configuration.

6. A semiconductor light emitting device according to claim 4 wherein said end surfaces are formed by etching.

7. A semiconductor light emitting device according to claim 4 wherein said reflective film is made of an insulator.

8. A semiconductor light emitting device according to claim 4 wherein said reflective film is a metal, an alloy, a semiconductor or an insulator, between which and said nitride III–V compound semiconductor layers a light transmissive insulation layer is formed.

9. A semiconductor light emitting device having nitride III–V compound semiconductor layers which form a light emitting device structure on one of two oppositely facing major surfaces of a light transmitting substrate, comprising:

a light transmissive smoothing film formed on the other of said major surfaces of said substrate, and a reflective film formed on a surface opposite to said substrate of said light transmissive smoothing film, wherein, light generated in said device and emitted to the other of said major surfaces goes through the light transmissive smoothing film and is reflected back by the reflective film and exits from the device from other than the other of said major surfaces.

10. A semiconductor light emitting device according to claim 9 wherein said reflective film is made of a metal, an alloy or a semiconductor.

11. A semiconductor light emitting device according to claim 9 wherein said reflective film is made of an insulator.

12. A semiconductor light emitting device according to claim 9 wherein said substrate is a sapphire substrate, a silicon carbide substrate or a gallium nitride substrate.

13. A semiconductor light emitting device according to claim 9 wherein both a p-side electrode and an n-side electrode are formed on one side of said substrate where said nitride III–V compound semiconductor layers are formed.

14. A semiconductor light emitting device according to claim 9 wherein a reflective film is formed on end surfaces of said nitride III–V compound semiconductor layers.

15. A semiconductor light emitting device according to claim 14 wherein at least a part of said end surfaces of said nitride III–V compound semiconductor layers has an inverted mesa configuration.

16. A semiconductor light emitting device according to claim 14 wherein said end surfaces are formed by etching.

17. A semiconductor light emitting device according to claim 14 wherein said reflective film is made of an insulator.

18. A semiconductor light emitting device according to claim 14 wherein said reflective film is a metal, an alloy, a semiconductor or an insulator, between which and said nitride III–V compound semiconductor layers a light transmissive insulation layer is formed.

* * * * *